United States Patent

Yokoi

(10) Patent No.: US 6,596,630 B2
(45) Date of Patent: Jul. 22, 2003

(54) METHOD OF CLEANING A SILICON SUBSTRATE AFTER BLANKET DEPOSITING A TUNGSTEN FILM BY DIPPING IN A SOLUTION OF HYDROFLUORIC ACID, HYDROCHLORIC ACID, AND/OR AMMONIUM HYDROXIDE

(75) Inventor: Naoki Yokoi, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/206,107

(22) Filed: Jul. 29, 2002

(65) Prior Publication Data

US 2002/0197847 A1 Dec. 26, 2002

Related U.S. Application Data

(63) Continuation of application No. 09/326,546, filed on Jun. 7, 1999, now Pat. No. 6,432,815.

(30) Foreign Application Priority Data

Dec. 21, 1998 (JP) .............................. 10-362753

(51) Int. Cl.[7] .......................................... H01L 21/4763
(52) U.S. Cl. ....................... 438/648; 438/656; 438/669; 438/685
(58) Field of Search ................. 438/627, 637, 438/643, 647, 648, 649, 653, 655, 656, 657, 669, 675, 682, 683, 684, 685

(56) References Cited

U.S. PATENT DOCUMENTS

| | | | |
|---|---|---|---|
| 5,323,045 A | 6/1994 | Murai | 257/380 |
| 5,677,237 A | 10/1997 | Tsai et al. | 438/627 |
| 5,893,756 A | 4/1999 | Berman et al. | 438/692 |
| 6,031,288 A | 2/2000 | Todorobaru et al. | 257/754 |
| 6,062,869 A | 5/2000 | Mizobuchi et al. | 438/225 |
| 6,232,228 B1 | 5/2001 | Kwag et al. | 438/669 |
| 6,329,681 B1 * | 12/2001 | Nakamura et al. | 257/297 |

FOREIGN PATENT DOCUMENTS

JP  10-70096 A  3/1998

* cited by examiner

Primary Examiner—Carl Whitehead, Jr.
Assistant Examiner—Stephen W. Smoot
(74) Attorney, Agent, or Firm—McDermott, Will & Emery

(57) ABSTRACT

A semiconductor device manufactured by cleaning without dissolving W, Ti, or TiN even if these metallic materials are exposed on the substrates to be cleaned, and a method for manufacturing such a semiconductor device. Impurities present on a silicon substrate can be removed while controlling the etching of a tungsten film exposed on the surface of a silicon substrate, by dipping and cleaning the silicon substrate in one or a plurality of chemical solutions selected from a group consisting of HF, HCl, and NH$_4$OH, under the condition that the surface of the silicon substrate is entirely covered with a tungsten film. After dry etching for patterning the tungsten film and the barrier metal, impurities present on a silicon substrate can be removed while controlling the etching of the tungsten film and the barrier metal exposed on the surface of a silicon substrate, by dipping and cleaning the silicon substrate in one or a plurality of chemical solutions selected from a group consisting of HCl and NH$_4$OH.

3 Claims, 9 Drawing Sheets

24 : interlayer insulation film

26 : W, TiN, Ti laminated film

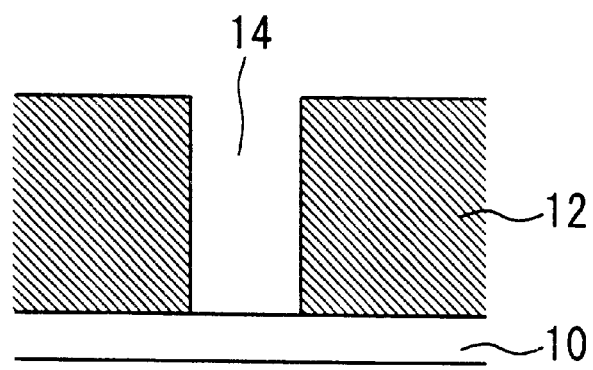
10: silicon substrate
12: interlayer insulation film
14: contact hole
F I G.  1
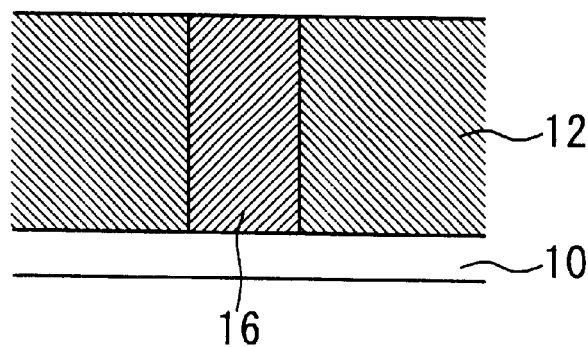
16: polysilicon plug
F I G.  2

18: barrier metal
20: tungsten film

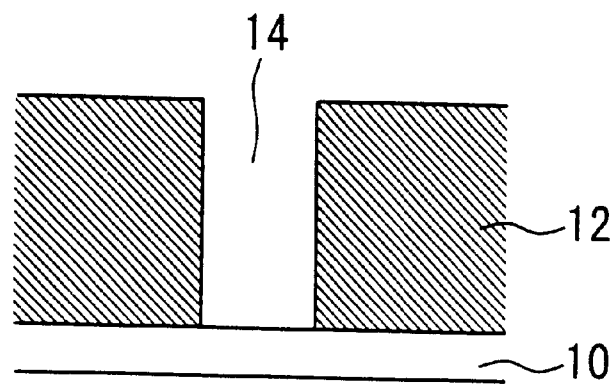
F I G. 5
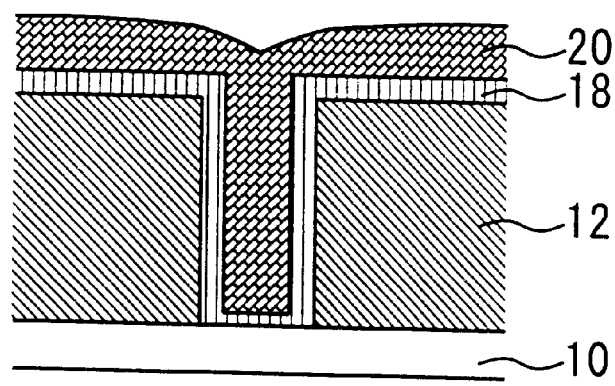
F I G. 6
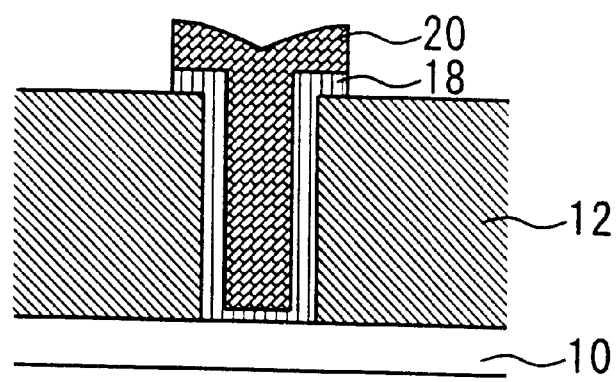
F I G. 7

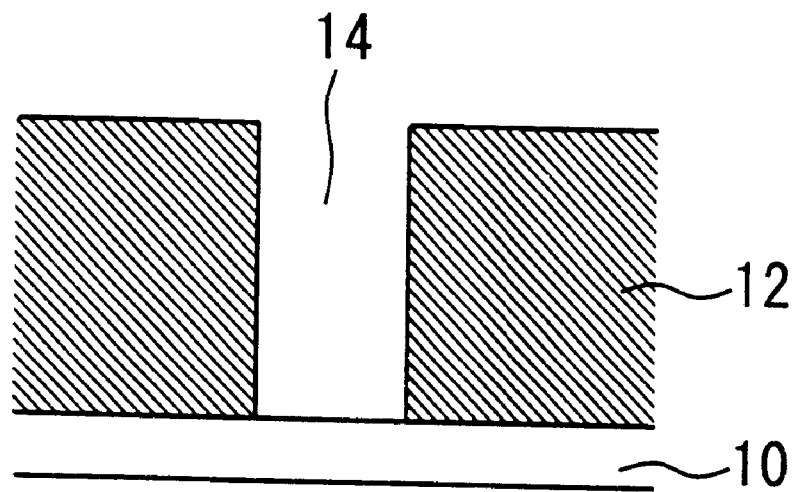
F I G. 8
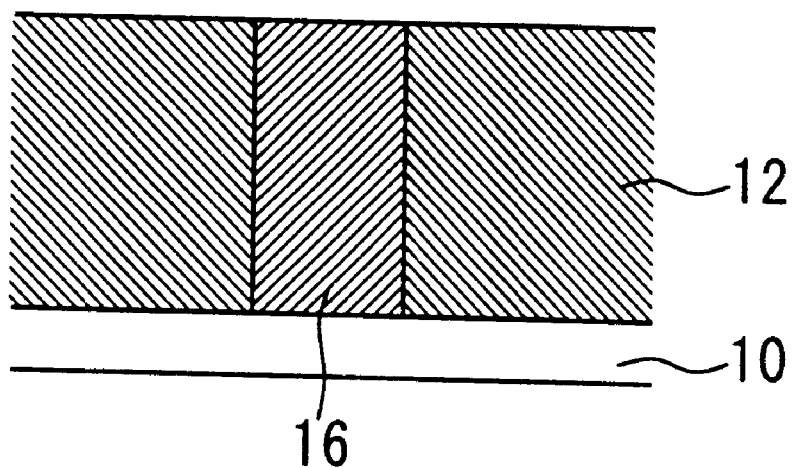
F I G. 9

22: cobalt silicide

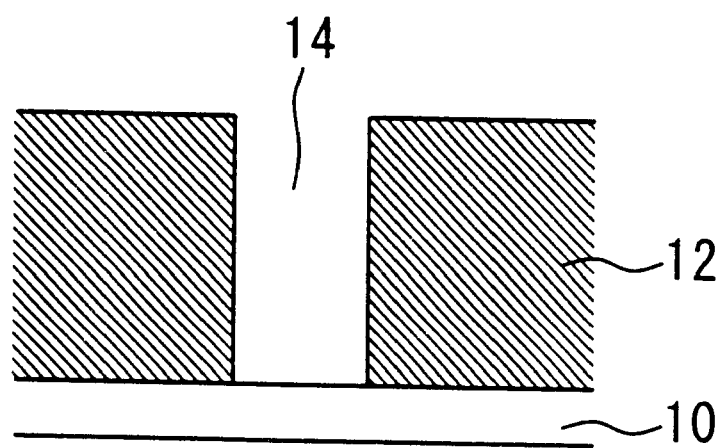
F I G. 1 6
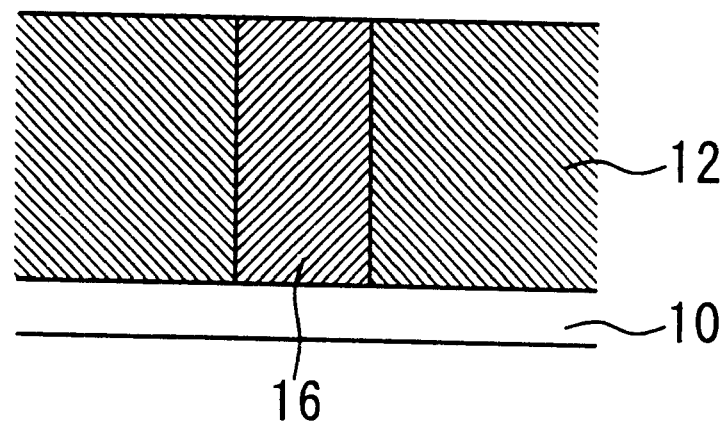
F I G. 1 7

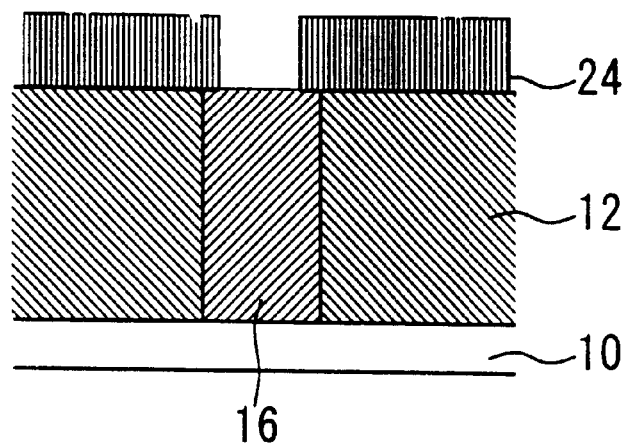
24 : interlayer insulation film
F I G. 1 8
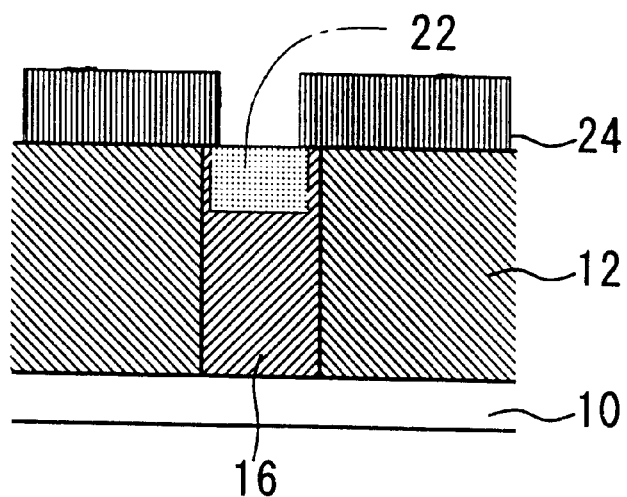
F I G. 1 9

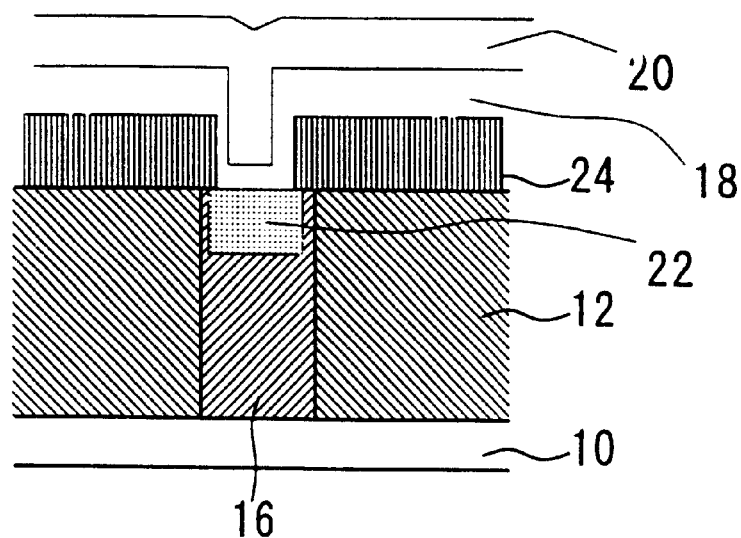
F I G. 2 0
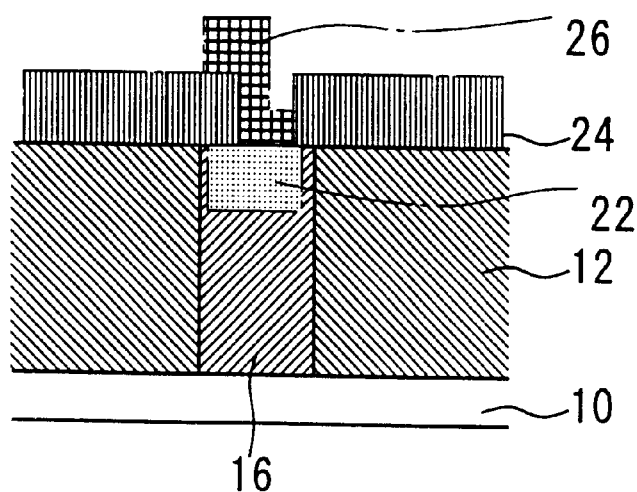
26 : W、T i N、T i laminated film
F I G. 2 1

METHOD OF CLEANING A SILICON SUBSTRATE AFTER BLANKET DEPOSITING A TUNGSTEN FILM BY DIPPING IN A SOLUTION OF HYDROFLUORIC ACID, HYDROCHLORIC ACID, AND/OR AMMONIUM HYDROXIDE

This application is a continuation of U.S. application Ser. No. 09/326,546, filed Jun. 7, 1999, now U.S. Pat. No. 6,432,815, issued Aug. 13, 2002.

BACKGROUND OF THE INVENTION

1. Field of the Invention

The present invention relates to a method of manufacturing a semiconductor device, and in particular to a semiconductor device and a method of manufacturing the same using tungsten, titanium, or titanium nitride as a material for wiring and the like.

2. Description of Related Art

Presently for the wet cleaning of silicon substrates in the manufacturing process for semiconductor devices, RCA cleaning is generally used. This RCA cleaning uses a hydrogen peroxide-sulfuric acid mixture (SPM), an ammonia-hydrogen peroxide mixture (APM), a hydrochloric acid-hydrogen peroxide mixture (HPM), or hydrofluoric acid (HF). Of these chemical solutions, SPM and HPM remove mainly metallic impurities from silicon substrates through oxidation. APM removes particles and organic impurities through lifting-off and decomposition by etching, and HF removes metallic impurities and natural oxides. In order to enhance impurity removal, SPM, APM, and HPM are used under a high temperature or a high concentration.

Heretofore, since the RCA cleaning described above has been applied to processes before metallic wiring, materials exposed on the surface of the silicon substrates and in direct contact with such chemical solutions have been limited to silicon and the compounds thereof. In processes before metallic wiring, on the other hand, when a structure consisting of tungsten (W), titanium (Ti), titanium nitride (TiN) is fabricated on a silicon substrate, RCA cleaning must be carried out under conditions where these materials are exposed on the surface of the substrate. Of the chemical solutions for RCA cleaning, however, since hydrogen peroxide, sulfuric acid, and hydrofluoric acid have properties to dissolve W, Ti and TiN, and Ti, respectively, if these materials are exposed on the silicon substrates, there is a problem that these metals are dissolved by conventional RCA cleaning.

As described above, when a semiconductor device is manufactured using a conventional cleaning method, since cleaning is carried out under conditions where W, Ti, and TiN are exposed, there has been a problem that these metals are dissolved.

SUMMARY OF THE INVENTION

It is therefore an object of the present invention to provide a semiconductor device manufactured through cleaning without dissolving W, Ti, or TiN even if these metallic materials exposed on the substrates to be cleaned, and a method for manufacturing such a semiconductor device.

According to a first aspect of the present invention, there is provided a method of manufacturing a semiconductor device comprising: an interlayer insulation film forming step for forming an interlayer insulation film on a silicon substrate; a barrier metal depositing step for depositing a barrier metal on said interlayer insulation film; a step for depositing a tungsten film on said barrier metal; a first cleaning step for cleaning said silicon substrate by dipping said silicon substrate in a solution of at least one selected from a group consisting of HF, HCl, and $NH_4OH$; a step for forming a photoresist pattern on said tungsten film; and a patterning step for patterning said tungsten film and said barrier metal using said photoresist pattern as a mask.

According to a second aspect of the present invention, there is provided a method of manufacturing a semiconductor device comprising: a step for forming an interlayer insulation film on a silicon substrate; a step for forming an opening in said interlayer insulation film: a step for depositing a barrier metal on said interlayer insulation film including in said opening; a step for depositing a tungsten film on said barrier metal; a first cleaning step for cleaning said silicon substrate by dipping said silicon substrate in a solution of at least one selected from a group consisting of HF, HCl, and $NH_4OH$; a step for forming a photoresist pattern on said tungsten film; and a patterning step for patterning said tungsten film and said barrier metal using said photoresist pattern as a mask.

According to a third aspect of the present invention, there is provided a method of manufacturing a semiconductor device comprising: an interlayer insulation film forming step for forming an interlayer insulation film on a silicon substrate; a step for forming an opening in said interlayer insulation film; a step for forming a polysilicon plug by depositing polysilicon in said opening; a step for forming cobalt silicide on the upper end of said polysilicon plug by the salicide process; a step for depositing a barrier metal on said interlayer insulation film including said cobalt silicide; a tungsten film depositing step for depositing a tungsten film on said barrier metal; a step for forming a photoresist pattern on said tungsten film; and a patterning step for patterning said tungsten film and said barrier metal using said photoresist pattern as a mask.

According to a fourth aspect of the present invention, there is provided a method of manufacturing a semiconductor device comprising: a step for forming an interlayer insulation film on a silicon substrate; a step for forming an opening in said interlayer insulation film; a step for depositing a barrier metal on said interlayer insulation film including in said opening; a step for depositing a tungsten film on said barrier metal; a first cleaning step for cleaning said silicon substrate by dipping said silicon substrate in a solution of at least one selected from a group consisting of HF, HCl, and $NH_4OH$; and a planarizing step for planarizing said tungsten film, said barrier metal, and said silicon oxide film by polishing.

According to a fifth aspect of the present invention, there is provided a semiconductor device comprising: a silicon substrate; an interlayer insulation film formed on said silicon substrate; a polysilicon plug formed by depositing polysilicon in an opening formed in said interlayer insulation film; a wiring part formed on the upper end of said polysilicon plug, said wiring part having a barrier metal formed in contact with said polysilicon plug, and a tungsten film deposited on said barrier metal; and cobalt silicide formed between the upper end of said polysilicon plug and said barrier metal, wherein said cobalt silicide prevents the dissolution of said polysilicon plug in the chemical solution for removing impurities present on the surface of said silicon substrate.

According to a sixth aspect of the present invention, there is provided a method of manufacturing a semiconductor device comprising: an interlayer insulation film forming step for forming a first interlayer insulation film on a silicon substrate; a step for forming an opening in said first interlayer insulation film; a step for forming a polysilicon plug by depositing polysilicon in said opening; a step for forming a second interlayer insulation film on said polysilicon plug and said first interlayer insulation film; a step for forming an opening in said second interlayer insulation film on said polysilicon plug; a step for forming cobalt silicide on the upper end of said polysilicon plug by the salicide process; a step for depositing a barrier metal on said cobalt silicide and said second interlayer insulation film; a tungsten film depositing step for depositing a tungsten film on said barrier metal; a step for forming a photoresist pattern on said tungsten film; and a patterning step for patterning said tungsten film and said barrier metal using said photoresist pattern as a mask.

The above and other objects, effects, features and advantages of the present invention will become more apparent from the following description of the embodiments thereof taken in conjunction with the accompanying drawings.

BRIEF DESCRIPTION OF THE DRAWINGS

FIGS. 1 through 4 show the process steps for forming a tungsten wiring according to Embodiment 1 of the present invention.

FIGS. 5 through 7 show the process steps for forming a tungsten wiring according to Embodiment 2 of the present invention.

FIGS. 8 through 12 show the process steps for forming a tungsten wiring according to Embodiment 3 of the present invention.

FIGS. 16 through 21 show the process steps for forming a tungsten wiring according to Embodiment 12 of the present invention.

DETAILED DESCRIPTION OF THE PREFERRED EMBODIMENTS

Figure 3:
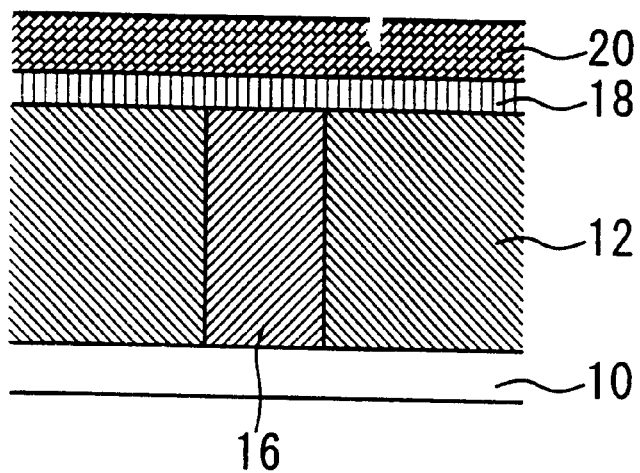

Embodiments of the present invention will be described below with reference to the accompanying drawings. It is noted that the same reference symbols in the drawings denote the same or corresponding components.

Embodiment 1

FIGS. 1 through 4 show the process steps for forming a tungsten wiring according to Embodiment 1 of the present invention. As FIG. 1 shows, an interlayer insulation film 12 such as a silicon oxide film is first formed on a silicon substrate 10 by chemical vapor deposition (CVD) and the like, and a contact hole 14 is formed in the interlayer insulation film 12 by photolithography and dry etching. Next, as FIG. 2 shows, polysilicon is deposited on the entire surface and in the contact hole 14, and excessive polysilicon is removed by dry etching and/or chemical mechanical polishing (CMP) to form a polysilicon plug 16.

Figure 4:
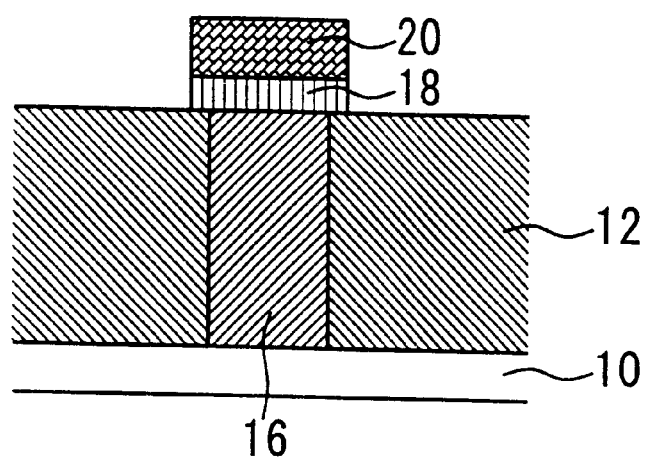

Then, as FIG. 3 shows, a barrier metal 18 such as TiN or Ti is deposited on the interlayer insulation film 12 and the polysilicon plug 16 by CVD or sputtering, and a tungsten film 20 which will become a wiring material is deposited on the barrier metal 18 by CVD or sputtering. Under a condition where the surface of the silicon substrate 10 is entirely covered by the tungsten film 20, the silicon substrate 10 is dipped and cleaned in one or a plurality of solutions selected from a group consisting of HF, HCl, and NH$_4$OH. By these solutions, impurities present on the silicon substrate 10 can be removed while restricting the etching of the tungsten film 20 exposed on the surface of the silicon substrate 10. Next, as FIG. 4 shows, the tungsten film 20 and the barrier metal 18 are patterned by photolithography and dry etching.

After dry etching, the silicon substrate 10 is dipped and cleaned in one or a plurality of solutions selected from a group consisting of HCl and NH$_4$OH. By these solutions, impurities present on the silicon substrate 10 can be removed while restricting the etching of the tungsten film 20 and the barrier metal 18 exposed on the surface of the silicon substrate 10.

According to Embodiment 1 as described above, impurities present on the silicon substrate 10 can be removed while restricting the etching of the tungsten film 20 exposed on the surface of the silicon substrate 10, by dipping and cleaning the silicon substrate 10 in one or a plurality of solutions selected from a group consisting of HF, HCl, and NH$_4$OH, under a condition where the surface of the silicon substrate 10 is entirely covered by the tungsten film 20. In addition, after dry etching for patterning the tungsten film 20 and the barrier metal 18, impurities present on the silicon substrate 10 can be removed while restricting the etching of the tungsten film 20 and the barrier metal 18 exposed on the surface of the silicon substrate 10, by dipping and cleaning the silicon substrate 10 in one or a plurality of solutions selected from a group consisting of HCl and NH$_4$OH.

In Embodiment 1 as described above, although the barrier metal 18 and the tungsten film 20 are deposited on the interlayer insulation film 12 and the polysilicon plug 16 after forming the polysilicon plug 16, it is needless to say that the method for producing a semiconductor device of the present invention can be applied to the case where no polysilicon plug 16 is formed. Furthermore, although cleaning is performed twice in Embodiment 1 described above, single cleaning is possible in the state where the surface of the silicon substrate 10 is entirely covered with the tungsten film 20. Similarly, cleaning can be performed only once after dry etching for patterning the tungsten film 20 and the barrier metal 18.

Embodiment 2

FIGS. 5 through 7 show the process steps for forming a tungsten wiring according to Embodiment 2 of the present invention. In FIGS. 5 through 7, since the identical numerals represent the like parts in FIG. 1 or FIG. 4, the description of these parts will be omitted. As FIG. 5 shows, an interlayer insulation film 12 such as a silicon oxide film is first formed on a silicon substrate 10 by CVD and the like, and an opening (contact hole) 14 is formed in the interlayer insulation film 12 by photolithography and dry etching. This opening in a vertical hole formed in the direction almost perpendicular to the surface of the silicon substrate 10, and includes, for example, a contact hole or a via hole. Next, as FIG. 6 shows, a barrier metal 18, such as TiN and Ti, is deposited on the entire surface including the bottom and side surfaces of the contact hole 14 by CVD or sputtering, and a tungsten film 20 which will become a wiring material is deposited on the barrier metal 18 by CVD or sputtering. In a state where the surface of the silicon substrate 10 is entirely covered by the tungsten film 20, the silicon substrate 10 is dipped and cleaned in one or a plurality of solutions selected from a group consisting of HF, HCl, and NH$_4$OH. By these solutions, impurities present on the silicon substrate 10 can be removed while restricting the etching of the tungsten film 20 exposed on the surface of the silicon substrate 10. Next, as FIG. 7 shows, the tungsten film 20 and the barrier metal 18 are patterned by photolithography and dry etching.

After dry etching, the silicon substrate 10 is dipped and cleaned in one or a plurality of solutions selected from a group consisting of HCl and NH$_4$OH. By these solutions, impurities present on the silicon substrate 10 can be removed while restricting the etching of the tungsten film 20 and the barrier metal 18 exposed on the surface of the silicon substrate 10.

According to Embodiment 2 as described above, impurities present on the silicon substrate 10 can be removed while restricting the etching of the tungsten film 20 exposed on the surface of the silicon substrate 10, by dipping and cleaning the silicon substrate 10 in one or a plurality of solutions selected from a group consisting of HF, HCl, and NH$_4$OH, under a condition where the surface of the silicon substrate 10 is entirely covered by the tungsten film 20. In addition after dry etching for patterning the tungsten film 20 and the barrier metal 18, impurities present on the silicon substrate 10 can be removed while restricting the etching of the tungsten film 20 and the barrier metal 18 exposed on the surface of the silicon substrate 10, by dipping and cleaning the silicon substrate 10 in one or a plurality of solutions selected from a group consisting of HCl and NH$_4$OH.

Although cleaning is performed twice in Embodiment 2 as described above, single cleaning is possible in the state where the surface of the silicon substrate 10 is entirely covered with the tungsten film 20. Similarly, cleaning can be performed only once after dry etching for patterning the tungsten film 20 and the barrier metal 18.

Embodiment 3

Figure 10:
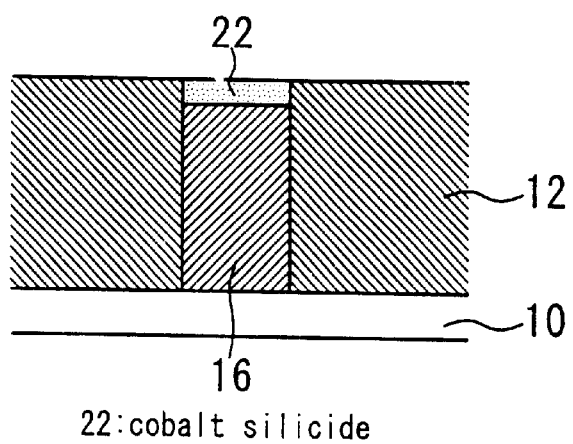
Figure 11:
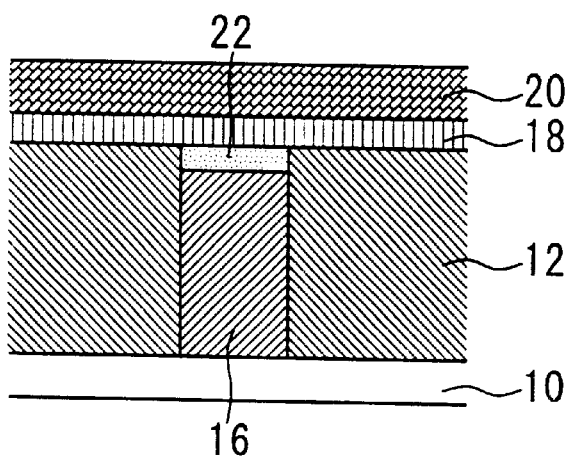

FIGS. 8 through 12 show the process steps for forming a tungsten wiring according to Embodiment 3 of the present invention. In FIGS. 8 through 12, since the identical numerals represent the like parts, the description of these parts will be omitted. As FIG. 8 shows, an interlayer insulation film 12 such as a silicon oxide film is first formed on a silicon substrate 10 by CVD and the like, and a contact hole 14 is formed in the interlayer insulation film 12 by photolithography and dry etching. Next, as FIG. 9 shows, polysilicon is deposited on the entire surface and in the contact hole 14 of the silicon substrate 10, by CVD, and excessive polysilicon is removed by dry etching and/or CMP to form a polysilicon plug 16. Next, as FIG. 10 shows, cobalt is deposited on the entire surface of the substrate 10 by sputtering, and cobalt silicide 22 is formed on the upper end of the polysilicon plug 16 using the salicide process. Then, as FIG. 11 shows, a barrier metal 18, such as TiN and Ti, is deposited on the entire surface of the substrate 10 including the bottom and side surfaces by CVD or sputtering, and a tungsten film 20 which will become a wiring material is deposited on the barrier metal 18 by CVD.

Under the condition that the surface of the silicon substrate 10 is entirely covered by the tungsten film 20, the silicon substrate 10 is dipped and cleaned in one or a plurality of solutions selected from a group consisting of HF, HCl, and NH$_4$OH. By these solutions, impurities present on the silicon substrate 10 can be removed while restricting the etching of the tungsten film 20 exposed on the surface of the silicon substrate 10.

Figure 12:
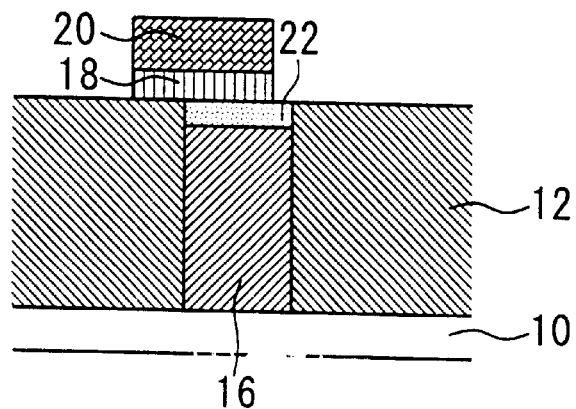

Next, as FIG. 12 shows, the tungsten film 20 and the barrier metal 18 are patterned by photolithography and dry etching.

After dry etching, the silicon substrate 10 is dipped and cleaned in one or a plurality of solutions selected from a group consisting of HCl and NH$_4$OH. By these solutions, impurities present on the silicon substrate 10 can be removed while restricting the etching of the tungsten film 20 and the barrier metal 18 exposed on the surface of the silicon substrate 10. Since cobalt silicide 22 is formed on the upper end of the polysilicon plug 16, the dissolution of the polysilicon plug 16 into the aqueous solution of NH$_4$OH can be prevented even if the polysilicon plug 16 is exposed on the surface of the silicon substrate 10 due to the borderless structure.

According to Embodiment 3 as described above, impurities present on the silicon substrate 10 can be removed while restricting the etching of the tungsten film 20 exposed on the surface of the silicon substrate 10, by dipping and cleaning the silicon substrate 10 in one or a plurality of solutions selected from a group consisting of HF, HCl, and NH$_4$OH, under a condition where the surface of the silicon substrate 10 is entirely covered by the tungsten film 20. In addition, after dry etching for patterning the tungsten film 20 and the barrier metal 18, impurities present on the silicon substrate 10 can be removed while restricting the etching of the tungsten film 20 and the barrier metal 18 exposed on the surface of the silicon substrate 10, by dipping and cleaning the silicon substrate 10 in one or a plurality of solutions selected from a group consisting of HCl and NH$_4$OH. Furthermore, since cobalt silicide 22 is formed on the upper end of the polysilicon plug 16, the dissolution of the polysilicon plug 16 into the aqueous solution of NH$_4$OH can be prevented even if the polysilicon plug 16 is exposed on the surface of the silicon substrate 10 due to the borderless structure.

Although cleaning is performed twice in Embodiment 3 as described above, single cleaning is possible in the state where the surface of the silicon substrate 10 is entirely covered with the tungsten film 20. Similarly, cleaning can be performed only once after dry etching for patterning the tungsten film 20 and the barrier metal 18.

Embodiment 4

Figure 13:
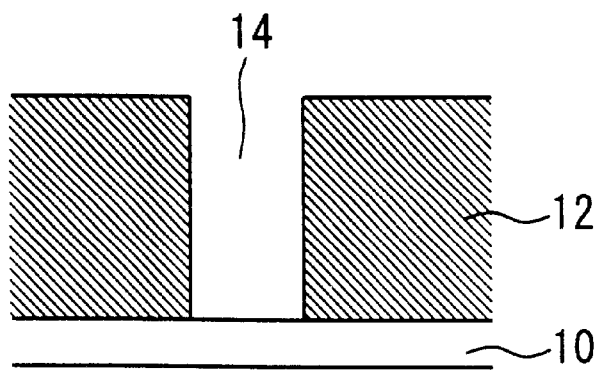
FIGS. 13 through 15 show the process steps for forming a tungsten wiring or plug according to Embodiment 4 of the present invention.
Figure 14:
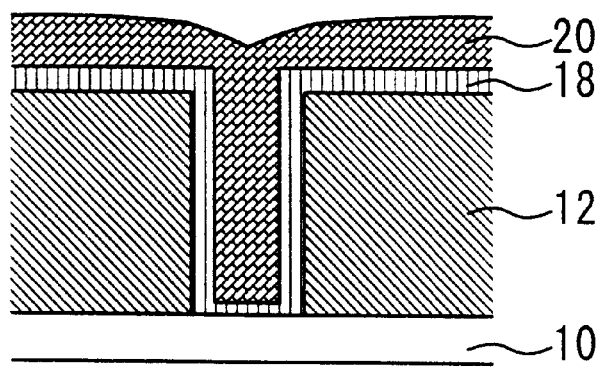
Figure 15:
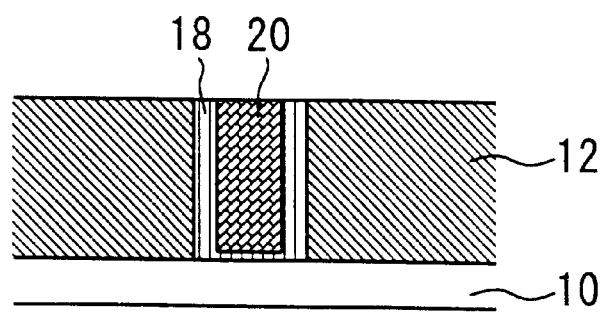

FIGS. 13 through 15 show the process steps for forming a tungsten wiring or plug according to Embodiment 4 of the present invention. In FIGS. 13 through 15, since the identical numerals represent the like parts in FIG. 1 or FIG. 4, the description of these parts will be omitted. As FIG. 13 shows, an interlayer insulation film 12 such as a silicon oxide film is first formed on a silicon substrate 10 by CVD and the like, and a channel or a contact hole 14 is formed in the interlayer insulation film 12 by photolithography and dry etching. Next, as FIG. 14 shows, a barrier metal 18, such as TiN and Ti, is deposited on the entire surface including the bottom and side surfaces of the contact hole 14 by CVD or sputtering, and a tungsten film 20 which will become a wiring material is deposited on the barrier metal 18 by CVD or sputtering. In the state where the surface of the silicon substrate 10 is entirely covered by the tungsten film 20, the silicon substrate 10 is dipped and cleaned in one or a plurality of solutions selected from a group consisting of HF, HCl, and NH$_4$OH. By these solutions, impurities present on the silicon substrate 10 can be removed while restricting the etching of the tungsten film 20 exposed on the surface of the silicon substrate 10. Next, as FIG. 15 shows, the channel or contact hole 14 in which the tungsten film 20 and the barrier metal 18 are buried and the interlayer insulation film 12 are planarized by CMP.

After CMP, the silicon substrate 10 is dipped and cleaned in one or a plurality of solutions selected from a group consisting of HCl and NH$_4$OH. By these solutions, impurities present on the silicon substrate 10 can be removed while restricting the etching of the tungsten film 20 and the barrier metal 18 exposed on the surface of the silicon substrate 10.

According to Embodiment 4 as described above, impurities present on the silicon substrate 10 can be removed while restricting the etching of the tungsten film 20 exposed on the surface of the silicon substrate 10 by dipping and cleaning the silicon substrate 10 in one or a plurality of solutions selected from a group consisting of HF, HCl, and $NH_4OH$, under a condition where the surface of the silicon substrate 10 is entirely covered by the tungsten film 20. In addition, after flattening by CMP the channel or contact hole 14 in which the tungsten film 20 and the barrier metal 18 are buried and the interlayer insulation film 12, impurities present on the silicon substrate 10 can be removed while restricting the etching of the tungsten film 20 and the barrier metal 18 exposed on the surface of the silicon substrate 10, by dipping and cleaning the silicon substrate 10 in one or a plurality of solutions selected from a group consisting of HCl and $NH_4OH$.

Although cleaning is performed twice in Embodiment 4 as described above, single cleaning is possible in the state where the surface of the silicon substrate 10 is entirely covered with the tungsten film 20. Similarly, it is possible only to clean the channel where the tungsten film 20 and the barrier metal 18 are buried, or the contact hole 14 and the interlayer insulation film 12 by CMP after the flattening.

Embodiment 5

Similarly to Embodiment 1 through Embodiment 4 as described above, in the process step for forming a tungsten wiring or plug, after the dry etching or CMP of the tungsten film and the barrier metal, only the back side of the silicon substrate is cleaned with HF using a discrete-type cleaning machine, and the silicon substrate is dipped and cleaned in one or a plurality of solutions selected from a group consisting of HCl and $NH_4OH$. According to Embodiment 5, not only similar effects as in Embodiment 1 through Embodiment 4 are obtained, but also the removal of metallic impurities present on the back side of the silicon substrate 10 can be enhanced.

According to Embodiment 5 as described above, by cleaning only the back side of the silicon substrate with HF using a discrete-type cleaning machine after the dry etching or CMP of the tungsten film and the barrier metal, the removal of metallic impurities present on only the back side of the silicon substrate can be enhanced.

Embodiment 6

Similarly to Embodiment 1 through Embodiment 5 as described above, in the process step for forming a tungsten wiring or plug, the chemical solution used for dipping and cleaning silicon substrates is disposed. According to Embodiment 6, not only similar effects as in Embodiment 1 through Embodiment 5 are obtained, but also the same cleaning machine can be used in common with other silicon substrates to which no metallic materials such as a tungsten film are applied without contaminating the other substrates (batches) to be cleaned.

According to Embodiment 6 as described above, since the chemical solution used for dipping and cleaning silicon substrates is disposed, the same cleaning machine can be used in common with other silicon substrates to which no metallic materials such as a tungsten film are applied without causing mutual contamination between batches.

Embodiment 7

Similarly to Embodiment 1 through Embodiment 6 as described above, in the process step for forming a tungsten wiring or plug, a chemical solution diluted to 1:50 to 1:1000 is used. According to Embodiment 7, not only similar effects as in Embodiment 1 through Embodiment 6 are obtained, but also the quantity of the chemical solution can be minimized even if the solution is disposed.

According to Embodiment 7 as described above, since the chemical solution diluted to 1:50 to 1:1000 is used, the quantity of the chemical solution can be minimized even if the solution is disposed.

Embodiment 8

Similarly to Embodiment 1 through Embodiment 7 as described above, in the process step for forming a tungsten wiring or plug, ultrasonic waves are radiated onto a silicon substrate while the silicon substrate is dipped in $NH_4OH$. According to Embodiment 8, not only similar effects as in Embodiment 1 through Embodiment 7 are obtained, but also the removal of particles in $NH_4OH$ can be enhanced.

According to Embodiment 8 as described above, the removal of particles in $NH_4OH$ can be enhanced by radiating ultrasonic waves onto a silicon substrate while the silicon substrate is dipped in $NH_4OH$.

Embodiment 9

Similarly to Embodiment 1 through Embodiment 8 as described above, in the process step for forming a tungsten wiring or plug, a chelating agent is added to $NH_4OH$.

According to Embodiment 9, not only similar effects as in Embodiment 1 through Embodiment 8 are obtained, but also the removal of metallic impurities in $NH_4OH$ can be enhanced.

According to Embodiment 9 as described above, the removal of metallic impurities in $NH_4OH$ can be enhanced by adding a chelating agent to $NH_4OH$.

Embodiment 10

Although HCl and $NH_4OH$ are used as the chemical solution for cleaning in Embodiment 1 through Embodiment 9 as described above, HCl-added anode water or $NH_4OH$-added cathode water can be used in place of HCl and $NH_4OH$, respectively. According to Embodiment 10, not only similar effects as in Embodiment 1 through Embodiment 9 are obtained, but also the removal of impurities can be enhanced.

According to Embodiment 10 as described above, the removal of impurities can be enhanced by using HCl-added anode water or $NH_4OH$-added cathode water in place of HCl and $NH_4OH$, respectively.

Embodiment 11

FIG. 12 shows a semiconductor device according to Embodiment 11 of the present invention. As FIG. 12 shows, the numeral 10 denotes a silicon substrate. 12 an interlayer insulation film such as a silicon oxide film formed on the silicon substrate 10 by CVD and the like, 14 a contact hole formed in the interlayer insulation film 12 by photolithography and dry etching, 16 a polysilicon plug formed by depositing polysilicon on the entire surface and in the contact hole 14 and removing excessive polysilicon by dry etching and/or CMP, 18 a barrier metal such as TiN and Ti formed in contact with the upper end of the polysilicon plug, and 20 a tungsten film deposited on the barrier metal 18. The wiring is constituted by the barrier metal 18 and the tungsten film 20. Between the upper end of the polysilicon plug 16 and the barrier metal 18 is formed cobalt silicide 22. By this cobalt silicide 22, even if the polysilicon plug 16 is exposed on the surface of the silicon substrate 10 due to the borderless structure, the dissolution of the polysilicon plug 16 into the aqueous solution of $NH_4OH$, which is used for removing impurities present on the silicon substrate 10, can be prevented.

According to Embodiment 11 as described above, since cobalt silicide 22 is formed on the upper end of the polysilicon plug 16, the dissolution of the polysilicon plug 16 into the aqueous solution of $NH_4OH$ can be prevented, even if the polysilicon plug 16 is exposed on the surface of the silicon substrate 10 due to the borderless structure.

Embodiment 12

FIGS. 16 through 21 show the process steps for forming a tungsten wiring according to Embodiment 12 of the present invention. In FIGS. 16 through 21, since the identical numerals as in FIGS. 1 through 10 represent the like parts, the description of these parts will be omitted. As FIG. 16 shows, an interlayer insulation film 12 such as a silicon oxide film is first formed on a silicon substrate 10 by CVD and the like, and a contact hole 14 is formed in the interlayer insulation film 12 by photolithography and dry etching. Next as FIG. 17 shows, polysilicon is deposited on the entire surface and in the contact hole 14 of the silicon substrate by CVD, and excessive polysilicon is removed by dry etching and/or CMP to form a polysilicon plug. Next, as FIG. 18 shows, an interlayer insulation film 24 is overlaid, and an opening is formed on the polysilicon plug 16. Next, as FIG. 19 shows, cobalt silicide 22 is formed on the upper end of the polysilicon plug 16 using the salicide process. Then, as FIG. 20 shows, a barrier metal film 18 such as a TiN or Ti film is formed on cobalt silicide 22 and the interlayer insulation film 24, on which a tungsten film 20 is deposited.

In a state where the surface of the silicon substrate 10 is entirely covered by the tungsten film 20, the silicon substrate 10 is dipped and cleaned in one or a plurality of solutions selected from a group consisting of HF, HCl, and $NH_4OH$. By these solutions, impurities present on the silicon substrate 10 can be removed while restricting the etching of the tungsten film 20 exposed on the surface of the silicon substrate 10.

As FIG. 21 shows, after cleaning as described above, the tungsten film 20 and the barrier metal 18 are patterned by photolithography and dry etching. After dry etching, the silicon substrate 10 is dipped and cleaned in one or a plurality of solutions selected from a group consisting of HCl and $NH_4OH$. By these solutions, impurities present on the silicon substrate 10 can be removed while restricting the etching of the W, TiN, or Ti laminated film 26 exposed on the surface of the silicon substrate 10. Here, if the upper end of the polysilicon plug 16 is exposed by over-etching during the dry etching of the tungsten film W20 and the barrier metal film 18, since cobalt silicide 22 is formed on the polysilicon plug 16, the dissolution of the polysilicon plug 16 into the aqueous solution of $NH_4OH$ can be prevented even if the polysilicon plug 16 is exposed on the surface of the silicon substrate 10.

According to Embodiment 12 as described above, impurities present on the silicon substrate 10 can be removed while restricting the etching of the tungsten film 20 exposed on the surface of the silicon substrate 10, by dipping and cleaning the silicon substrate 10 in one or a plurality of solutions selected from a group consisting of HF, HCl, and $NH_4OH$, under a condition where the surface of the silicon substrate 10 is entirely covered by the tungsten film 20. In addition, after dry etching for patterning the tungsten film 20 and the barrier metal film 18, impurities present on the silicon substrate 10 can be removed while restricting the etching of the W, TiN, or Ti laminated film 26 exposed on the surface of the silicon substrate 10, by dipping and cleaning the silicon substrate 10 in one or a plurality of solutions selected from a group consisting of HCl and $NH_4OH$.

Although cleaning is performed twice in Embodiment 12 as described above, single cleaning is possible in the state where the surface of the silicon substrate 10 is entirely covered with the tungsten film 20. Similarly, cleaning can be performed only once after dry etching.

According to the semiconductor device and the method for manufacturing the same, as described above, there are provided the semiconductor device and the method for manufacturing the same using the cleaning of the substrate without dissolving metallic materials such as W, Ti, and TiN, even if these metallic materials are exposed on the surface of the substrate to be cleaned Here, the method of manufacturing a semiconductor device may further comprise a second cleaning step for cleaning the silicon substrate by dipping the silicon substrate in a solution of at least one selected from a group consisting of HCl and $NH_4OH$ after the planarizing step.

Here, the method of manufacturing a semiconductor device may further comprise a second cleaning step for cleaning only the back side of the silicon substrate with HF using a discrete-type cleaning machine after the planarizing step.

In the method of manufacturing a semiconductor device, the mixing ratio of the chemical solution to pure water is within a range between 1:50 and 1:1000.

In the method of manufacturing a semiconductor device, when the silicon substrate is cleaned by dipping in an $NH_4OH$ solution, a chelating agent is added to the $NH_4OH$ solution.

In the method of manufacturing a semiconductor device, HCl used in the first cleaning step or the second cleaning step is mixed with anode water.

In the method of manufacturing a semiconductor device, $NH_4OH$ used in the first cleaning step or the second cleaning step is mixed with cathode water.

Here, the method of manufacturing a semiconductor device may further comprise a first cleaning step for cleaning the silicon substrate by dipping the silicon substrate in a solution of at least one selected from a group consisting of HF, HCl, and $NH_4OH$ after the tungsten film depositing step.

Here, the method of manufacturing a semiconductor device may further comprise a second cleaning step for cleaning the silicon substrate by dipping the silicon substrate in a solution of at least one selected from a group consisting of HCl and $NH_4OH$ after the patterning step.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed is:

1. A method of manufacturing a semiconductor device, comprising the sequential steps of:

forming a first interlayer insulation film on a silicon substrate;

forming an opening in the first interlayer insulation film;

forming a polysilicon plug by depositing polysilicon in the opening;

forming a second interlayer insulation film on the polysilicon plug and the first interlayer insulation film;

forming an opening in the second interlayer insulation film on the polysilicon plug;

depositing a barrier metal on the polysilicon plug and the second interlayer insulation film;

depositing a tungsten film on the barrier metal;

cleaning the silicon substrate by dipping the silicon substrate in a solution of at least one selected from a group consisting of HF, HCl and $NH_4OH$ immediately after depositing the tungsten film wherein the tungsten film is exposed to the solution during cleaning;

forming a photoresist pattern on the tungsten film; and patterning the tungsten film and the barrier metal using the photoresist pattern as a mask.

2. A method of manufacturing a semiconductor device, comprising the sequential steps of:

forming a first interlayer insulating film on a silicon substrate;

forming an opening in the first interlayer insulation film;

forming a polysilicon plug by depositing polysilicon in the opening;

forming a second interlayer insulation film on the polysilicon plug and the first interlayer insulating film;

forming an opening in the second interlayer insulation film on the polysilicon plug;

forming cobalt silicide on the upper end of the polysilicon plug by the salicide process;

depositing a barrier metal on the cobalt suicide and the second interlayer insulation film;

depositing a tungsten film on the barrier metal;

cleaning the silicon substrate by dipping the silicon substrate in a solution of at least one selected from a group consisting of HF, HCl, and $NH_4OH$ immediately after depositing the tungsten film wherein the tungsten film is exposed to the solution during cleaning;

forming a photoresist pattern on the tungsten film; and patterning the tungsten film and the barrier metal using the photoresist pattern as a mask.

3. The method of manufacturing a semiconductor device according to claim 2, further comprising a step of cleaning the silicon substrate by dipping the silicon substrate in a solution of at least one selected from a group consisting of HCl and $NH_4OH$ after the step of patterning the tungsten film and the barrier metal.

* * * * *